United States Patent [19]

Nakao

[11] Patent Number: 5,293,062
[45] Date of Patent: Mar. 8, 1994

[54] FET NONVOLATILE MEMORY WITH COMPOSITE GATE INSULATING LAYER

[75] Inventor: Hironobu Nakao, Kyoto, Japan
[73] Assignee: Rohm Co., Ltd., Kyoto, Japan
[21] Appl. No.: 801,537
[22] Filed: Dec. 2, 1991

[30] Foreign Application Priority Data

May 25, 1991 [JP] Japan ................................. 3-149414

[51] Int. Cl.⁵ ...................... H01L 29/78; H01L 23/48; H01L 29/46; H01L 29/62
[52] U.S. Cl. .................................. 257/638; 257/288; 257/325; 257/326; 257/506; 257/546; 257/635; 257/637; 257/640; 257/646; 257/649
[58] Field of Search ............... 257/218, 249, 250, 263, 257/269, 270, 288, 506, 546, 635, 636, 637, 638, 640, 645, 324, 325, 326, 639, 646, 649

Primary Examiner—Andrew J. James
Assistant Examiner—Alice W. Tang
Attorney, Agent, or Firm—Brumbaugh, Graves, Donohue & Raymond

[57] ABSTRACT

A gate insulating layer, which is formed on a channel region of a semiconductor substrate and interposed between the semiconductor substrate and a gate electrode, consists of a first part and a second part adjoining each other. The first part includes an oxide lower layer and a nitride upper layer, and a second part includes a nitride lower layer and an oxide upper layer.

4 Claims, 2 Drawing Sheets

FET NONVOLATILE MEMORY WITH COMPOSITE GATE INSULATING LAYER

BACKGROUND OF THE INVENTION

The present invention relates to a nonvolatile memory of a field effect transistor (FET).

FIG. 5 shows a conventional nonvolatile memory having a MNOS structure. An oxide layer 4 of $SiO_2$ and a nitride layer 5 of SiN are sequentially formed on a channel between a source region 2 and a drain region 3 of a semiconductor substrate 1, and constitute an insulating layer interposed between the substrate 1 and a gate electrode 6. At the time of writing an electric charge, a high voltage E1 is applied between the substrate 1 and the gate electrode 6 to thereby allow electrons to tunnel through the oxide layer 4 from the substrate side into the nitrile layer 5, where they are trapped. At the time of reading out the electric charge, a low voltage E2 is applied to provide such a state that a current can flow between the source region 2 and the drain region 3 (the FET is turned on). Of course, if the high voltage E1 was not applied during the writing, there exist no electrons trapped in the nitride layer 5, providing such a state in the reading that no current can flow between the source region 2 and the drain region 3 (i.e., the FET is turned off).

In order to erase the above trapping state of electrons, a high voltage E3 of the opposite polarity is applied to have the electrons return to the substrate side.

As described above, in the conventional nonvolatile memory, an electric charge is injected into and removed from the nitride layer 5 through the oxide layer 4. Therefore, the oxide layer 4 deteriorates in quality. The deterioration of the layer quality makes it easier for the electric charge to flow therethrough (i.e., to escape from the nitride layer 5), which worsens the data storing performance of the memory. Further, while the oxide layer 4 must have a small thickness of 15-30 Å to allow an electric charge to go through it, it is generally difficult to form such a thin oxide layer uniformly in a stable manner.

On the other hand, the thickness of the nitride layer 5 of SiN is determined in view of the trapping length of a hole, and it is known that if the thickness of the nitride layer 5 is 190 Å or less, the memory performance is degraded. That is, the nitride layer 5 should have a thickness of more than 190 Å. However, with such a thick nitride layer, a higher voltage develops across the nitride layer 5 during the writing and erasing. This causes a problem that the amount of energy consumed in the nitride layer 5 is greater than that required for the writing or erasing itself of data.

SUMMARY OF THE INVENTION

The present invention has been made in view of the above problems in the art. Accordingly, it is an object of the invention to provide a field effect transistor nonvolatile memory in which the thickness of an oxide layer can be increased while a voltage to be applied between a gate electrode and a substrate in writing or erasing an electric charge can be reduced.

In order to achieve the above object, according to a field effect transistor nonvolatile memory of the invention, a gate insulating layer, which is formed on a channel region of a semiconductor substrate and interposed between a gate electrode and the substrate, consists of a first part and a second part adjoining each other. The first part includes an oxide lower layer and an upper layer of a nitride or a dielectric. The second part includes a lower layer of a nitride or a dielectric and an oxide upper layer.

With the above structure, the respective oxide layers of the first and second parts can be made sufficiently thick, so that an electric charge does not go through the oxide layers during the writing. On the other hand, an electric charge is allowed to go through the nitride layers (or dielectric layers), but prevented by the oxide layers from reaching the gate electrode or the substrate. As a result, in the first part holes are released from the boundary between the oxide layer and the nitride layer (or dielectric layer) and trapped in the nitride layer, while in the second part electrons are released from the boundary between the oxide layer and the nitride layer (or dielectric layer) and trapped in the nitride layer.

When a low voltage is applied between the gate and the substrate in the reading, the FET is turned on by the tunnel effect. If no electric charge has been written, the FET is turned off in the reading.

The stored electric charge is erased by applying a reverse bias voltage between the gate and the substrate. This is based on the mechanism that the trapped holes in the first part flow toward the gate electrode and the trapped electrons in the second part flow toward the substrate.

DESCRIPTION OF THE PREFERRED EMBODIMENTS

Embodiments of the present invention are described with reference to the accompanying drawings.

Figure 1:
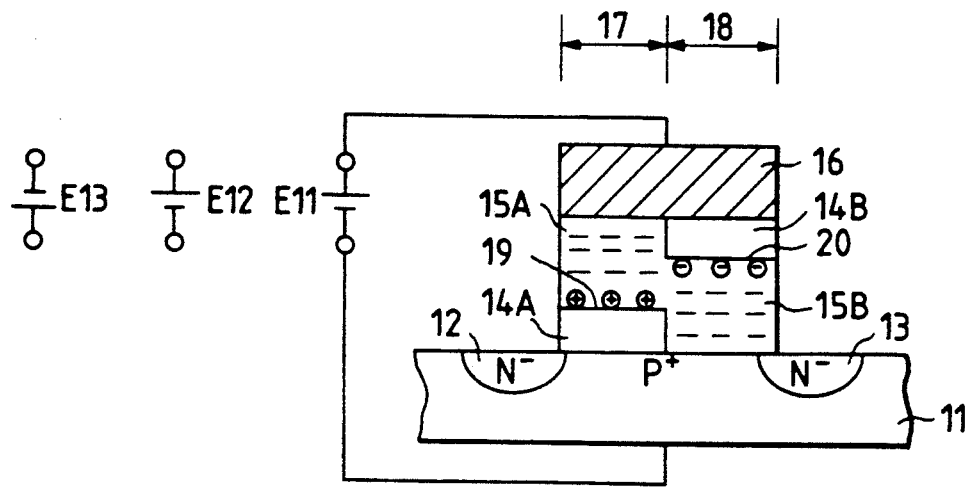
FIG. 1 is a sectional view showing the structure of a nonvolatile memory according to a first embodiment of the present invention.

FIG. 1 shows a field effect transistor nonvolatile memory according to a first embodiment of the invention. An insulating layer, which is formed on a channel between a source region 12 and a drain region 13 of a $P^+$-type semiconductor substrate 11 and is interposed between the substrate 11 and a gate electrode 16, consists of a first part 17 and a second part 18 adjoining each other. The first part 17 includes a lower layer of a thick, $SiO_2$ oxide layer 14A having a thickness of 30 Å or more and an upper layer of an SiN nitride layer 15A having a thickness of 190 Å or less. The second part 18 includes a lower layer 15B of an SiN nitride layer having a thickness of 190 Å or less and an upper layer 14B of a thick, $SiO_2$ oxide layer having a thickness of 30 Å or more. The $SiO_2$ layers 14A and 14B and the SiN layers 15A and 15B are formed using conventional layer formation and masking techniques.

With the above gate insulating layer, electrons and holes can be injected into the nitride layers 15A, 15B more easily than into the oxide layers 14A, 14B. An electric charge cannot be trapped within a bulk because the nitride layers 15A, 15B have a thickness of 190 Å or less. However, since the sufficiently thick oxide lower layers 14A and oxide upper layer 14B work as a barrier, during the electric charge writing when a voltage E11 is applied between the gate electrode 16 and the substrate 11, electric charges are sequentially released from respective boundaries 19, 20 between the nitride and oxide layers and trapped in the nitride layers 15A, 15B, so that the electric charges can be stored.

At the time of the reading, although a voltage E12 lower than the above writing voltage is applied, the FET is turned on by virtue of the tunnel effect. It is assumed here that impurity densities of the substrate 11, source region 12 and drain region 13 were previously set so that the FET is turned off in the reading in the case where no electric charge was written.

During the erasing, a voltage E13 of the opposite polarity is applied, so that trapped holes and electrons are allowed to flow toward the gate electrode 16 and substrate 11, respectively.

In the above embodiment, since the nitride layers 15A, 15B can be made thin, only a smaller part of the applied voltage develops across the nitride layers 15A, 15B, so that the voltage to be applied (i.e., the writing voltage E11 and erasing voltage E13) can be reduced as much. Further, since no electric charge goes through the oxide layers 14A, 14B, their quality hardly deteriorate. Further, the oxide layers as thick as 30 Å or more can be formed easily.

Figure 2:
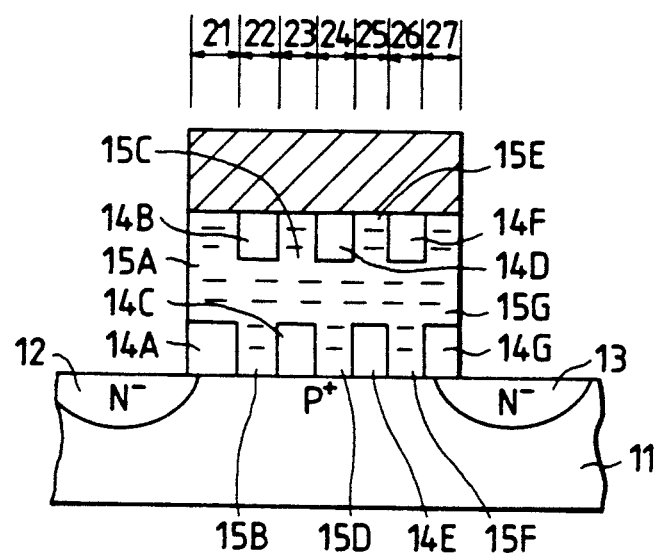
FIG. 2 is a sectional view showing the structure of a nonvolatile memory according to a second embodiment of the invention.

FIG. 2 shows a second embodiment. Each of four first parts 21, 23, 25, 27 has an oxide layer as a lower layer and a nitride layer as an upper layer, and each of three second parts 22, 24 and 26 has a nitride layer as a lower layer and an oxide layer as an upper layer. In this figure, reference characters 14A-14G represent the oxide layers, and 15A-15G represent the nitride layers. The structure of FIG. 2 is identical with that of FIG. 1, except that a plurality of first and second parts are employed. Therefore, a detailed description therefor is omitted here.

Figure 3A:
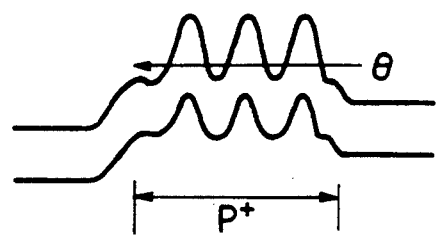
FIGS. 3(a) and 3(b) are energy band diagrams illustrative of the operation of the nonvolatile memory of FIG. 2.
Figure 3B:
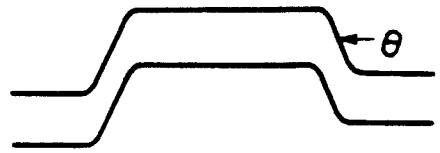

FIGS. 3(a) and 3(b) show an energy band structure of the channel and a mechanism of the current flow in the nonvolatile memory of FIG. 2. FIG. 3(a) shows a case in which an electric charge has been written, and FIG. 3(b) shows a case in which an electric charge has not been written (that is, the memory is erased). As shown in FIG. 3(a), where an electric charge has been written, the barrier height is lowered at the portions below the first parts 21, 23, 25, 27 into which holes have been injected. Although the barrier height is increased at the portions below the second parts 22, 24, 26 into which electrons have been injected, electrons are allowed to tunnel through the barriers corresponding to the second parts.

As shown in FIG. 3(b), in the erased state in which no electric charge has been written, the barrier is high over the entire channel, so that electrons cannot tunnel through the barrier. The energy band structure which provides the barriers as shown in FIGS. 3(a) and 3(b) can be realized by properly controlling the impurity densities of the P-type substrate 11 and the N-type source region 12 and drain region 13.

It should be noted here that, in the above embodiments, similar results can be obtained even if a dielectric layer is substituted for the nitride layer.

Figure 4:
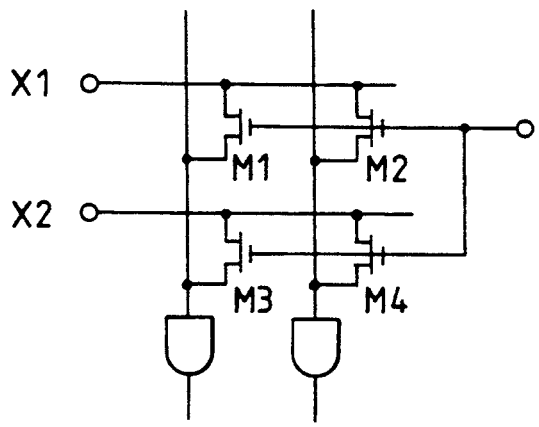
FIG. 4 is a circuit diagram showing an example of a gate array using the nonvolatile memories according to the invention.
Figure 5:
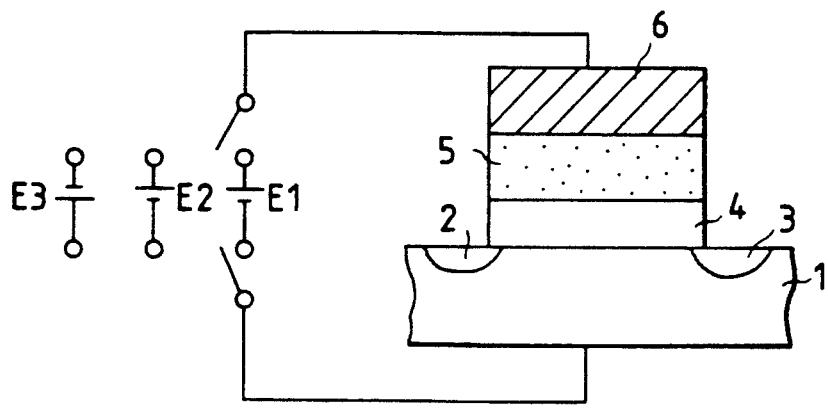
FIG. 5 is a sectional view showing the structure of a conventional nonvolatile memory.

FIG. 4 shows an example of a gate array in which the above-described nonvolatile memories are used as switches. As shown, nonvolatile memories M1-M4 are arranged in matrix form. The memory into which an electric charge has been written is turned on as a switch because its channel is conductive, while the memory into which no electric charge has been written is turned off as a switch because its channel is not conductive. In this figure, reference characters X1 and X2 represent inputs.

The circuit of FIG. 4 is applied to FPGAs (Field Programmable Gate Array) and PLAs (Programmable Logic Array). In conventional FPGAs and PLAs, gate arrays are connected together by use of a fuse, and disconnected from each other by melting the fuse. However, this conventional method is inconvenient in that, if once cut off, the fuse cannot be reconstructed in production.

On the other hand, if the nonvolatile memories are used as switches as shown in FIG. 4, the gate array combination can be programmed externally, which is very convenient. In addition, since the writing voltage and erasing voltage can be reduced in the nonvolatile memory of the above embodiments, a programming voltage can also be lowered.

As described in the foregoing, according to the nonvolatile memory of the present invention, since the thickness of the oxide layer of the gate insulating layer can be increased, the oxide layer can be formed more easily. Since an electric charge need not tunnel through the oxide layer, the quality of the oxide layer hardly deteriorates. Further, since the nitride layer can be thinner than the conventional one, a smaller amount of energy is consumed in the nitride layer, and the voltage to be applied between the gate electrode and the substrate in writing or erasing an electric charge can be reduced as much.

What is claimed is:

1. A field effect transistor nonvolatile memory having a gate insulating layer formed on a channel region of a semiconductor substrate and interposed between a gate electrode and the semiconductor substrate, said gate insulating layer comprising:
    a first part including a first oxide layer formed on and in direct contact with the channel region and a first nitride layer formed between the gate electrode and the first oxide layer; and
    a second part including a second nitride layer formed on and in direct contact with the channel region and a second oxide layer formed between the gate electrode and the second nitride layer;
    wherein the first and second parts are arranged adjacent to each other between a source region and a drain region.

2. The nonvolatile memory of claim 1, wherein a plurality of first parts and a plurality of second parts are alternately arranged adjacent each other in the first direction.

3. The nonvolatile memory of claim 1, wherein the first and second oxide layers have a thickness not less than 30 Å.

4. The nonvolatile memory of claim 1, wherein the first and second nitride layers have a thickness not more than 190 Å.

* * * * *